(12) United States Patent
Hung et al.

(10) Patent No.: US 10,658,234 B2
(45) Date of Patent: May 19, 2020

(54) FORMATION METHOD OF INTERCONNECTION STRUCTURE OF SEMICONDUCTOR DEVICE

(71) Applicant: Taiwan Semiconductor Manufacturing Co., Ltd., Hsinchu (TW)

(72) Inventors: Min-Hsiu Hung, Tainan (TW); Sung-Li Wang, Zhubei (TW); Pei-Wen Wu, Xinfeng Township, Hsinchu County (TW); Yida Li, Hsinchu (TW); Chih-Wei Chang, Jhudong Township, Hsinchu County (TW); Huang-Yi Huang, Hsinchu (TW); Cheng-Tung Lin, Jhudong Township, Hsinchu County (TW); Jyh-Cherng Sheu, Hsinchu (TW); Yee-Chia Yeo, Hsinchu (TW); Chi-On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/223,902

(22) Filed: Jul. 29, 2016

(65) Prior Publication Data

US 2018/0033687 A1    Feb. 1, 2018

(51) Int. Cl.
*H01L 21/44* (2006.01)
*H01L 21/768* (2006.01)
(Continued)

(52) U.S. Cl.
CPC .. *H01L 21/76856* (2013.01); *H01L 21/28518* (2013.01); *H01L 21/76841* (2013.01); *H01L 21/76843* (2013.01); *H01L 21/76846* (2013.01); *H01L 21/76855* (2013.01); *H01L 21/76862* (2013.01); *H01L 21/76877* (2013.01); *H01L 21/76889* (2013.01); *H01L 23/485* (2013.01); *H01L 23/5226* (2013.01); *H01L 23/53209* (2013.01); *H01L 23/53223* (2013.01);
(Continued)

(58) Field of Classification Search
CPC ........ H01L 21/76856; H01L 21/76843; H01L 21/7685; H01L 23/53209; H01L 23/5226; H01L 21/76846; H01L 21/76862; H01L 21/28518; H01L 21/76877; H01L 21/76841; H01L 21/76889
USPC .......................... 438/653, 648, 652, 654, 762
See application file for complete search history.

(56) References Cited

U.S. PATENT DOCUMENTS

2002/0019127 A1* 2/2002 Givens .............. H01L 21/28518
                                                                  438/637
2002/0137356 A1* 9/2002 Huang ................ H01L 21/2855
                                                                  438/740
(Continued)

*Primary Examiner* — Shouxiang Hu
(74) *Attorney, Agent, or Firm* — Birch, Stewart, Kolasch & Birch, LLP

(57) ABSTRACT

Structures and formation methods of a semiconductor device structure are provided. The method includes forming a dielectric layer over a semiconductor substrate and forming an opening in the dielectric layer to expose a conductive element. The method also includes forming a conductive layer over the conductive element and modifying an upper portion of the conductive layer using a plasma operation to form a modified region. The method further includes forming a conductive plug over the modified region.

20 Claims, 10 Drawing Sheets

(51) Int. Cl.
*H01L 23/522* (2006.01)
*H01L 23/485* (2006.01)
*H01L 21/285* (2006.01)
*H01L 23/532* (2006.01)

(52) U.S. Cl.
CPC .. *H01L 23/53238* (2013.01); *H01L 23/53252* (2013.01); *H01L 23/53266* (2013.01)

(56) References Cited

U.S. PATENT DOCUMENTS

2003/0025207 A1* 2/2003 Harada ............. H01L 21/28556
 257/758
2003/0236003 A1* 12/2003 Koo ................. H01L 21/28518
 438/795
2004/0005775 A1* 1/2004 Chou ................ H01L 21/76802
 438/653
2009/0149020 A1* 6/2009 Hayashi ................. C23C 16/14
 438/653

* cited by examiner

FORMATION METHOD OF INTERCONNECTION STRUCTURE OF SEMICONDUCTOR DEVICE

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
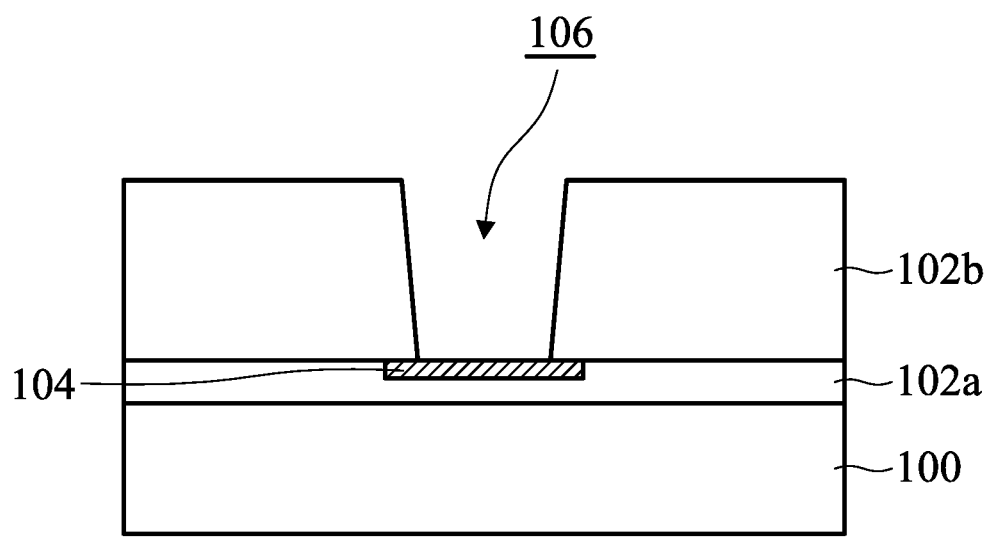
FIGS. 1A-1E are cross-sectional views of various stage of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1E are cross-sectional views of various stages of a process for forming a semiconductor device structure, in accordance with some embodiments. A semiconductor substrate 100 is received or provided. In some embodiments, the semiconductor substrate 100 is a bulk semiconductor substrate, such as a semiconductor wafer. For example, the semiconductor substrate 100 is a silicon wafer. The semiconductor substrate 100 may include silicon or another elementary semiconductor material such as germanium. In some other embodiments, the semiconductor substrate 100 includes a compound semiconductor. The compound semiconductor may include gallium arsenide, silicon carbide, indium arsenide, indium phosphide, another suitable material, or a combination thereof.

In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, an interconnection structure is formed on the semiconductor substrate 100. The interconnection structure includes multiple interlayer dielectric layers including dielectric layers 102a and 102b. The interconnection structure also includes multiple conductive features formed in the interlayer dielectric layers. The conductive features may include conductive lines, conductive vias, and/or conductive contacts.

In some embodiments, various device elements are formed in the semiconductor substrate 100. Examples of the various device elements include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, or other suitable elements. Various processes may be used to form the various device elements, including deposition, etching, implantation, photolithography, annealing, and/or other suitable processes.

The device elements are interconnected through the interconnection structure over the semiconductor substrate 100 to form integrated circuit devices. The integrated circuit devices include logic devices, memory devices (e.g., static random access memories, SRAMs), radio frequency (RF) devices, input/output (I/O) devices, system-on-chip (SoC)

devices, image sensor devices, other applicable types of devices, or a combination thereof.

As shown in FIG. 1A, the dielectric layer 102*a* is formed over the semiconductor substrate 100, and a conductive element 104 is formed in the dielectric layer 102*a*. In some embodiments, the conductive element 104 is a conductive line or a conductive via. The conductive element 104 may be electrically connected to one of the device elements formed in the semiconductor substrate 100 through other conductive features (not shown).

The dielectric layer 102*a* may be made of silicon oxide, silicon oxynitride, borosilicate glass (BSG), phosphoric silicate glass (PSG), borophosphosilicate glass (BPSG), fluorinated silicate glass (FSG), low-k material, porous dielectric material, another suitable material, or a combination thereof. The conductive element 104 may be made of copper, aluminum, cobalt, titanium, tantalum, ruthenium, tungsten, nickel, silver, gold, nitride thereof, carbide thereof, oxide thereof, another suitable material, or a combination thereof.

Afterwards, the dielectric layer 102*b* is deposited over the dielectric layer 102*a* and the conductive element 104. In some embodiments, the dielectric layer 102*b* is deposited using a chemical vapor deposition (CVD) process, an atomic layer deposition (ALD) process, a spin-on process, a spray coating process, another applicable process, or a combination thereof.

Afterwards, an opening 106 is formed in the dielectric layer 102*b* to expose the conductive element 104, as shown in FIG. 1A in accordance with some embodiments. In some embodiments, the formation of the opening 106 involves a photolithography process and an etching process. In some embodiments, the opening 106 is a trench used for containing a conductive line. In some other embodiments, the opening 106 is a hole used for containing a conductive via.

Figure 1B:
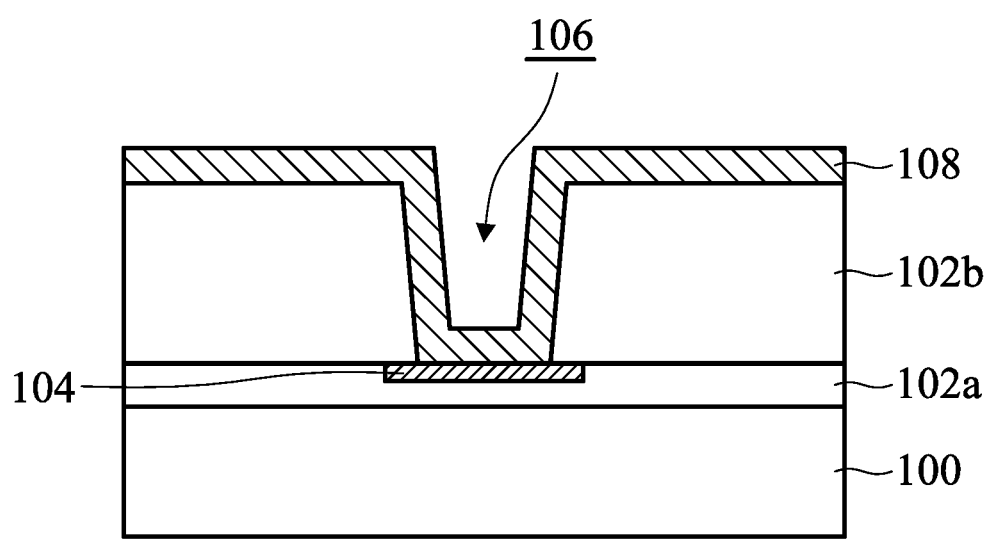

As shown in FIG. 1B, a conductive layer 108 is deposited over the dielectric layer 102*b* and the conductive element 104, in accordance with some embodiments. In some embodiments, the conductive layer 108 extends on sidewalls and a bottom of the opening 106. In some embodiments, the conductive layer 108 is electrically connected to the conductive element 104. In some embodiments, the conductive layer 108 is in direct contact with the conductive element 104. The conductive layer 108 may be made of a metal material. The metal material may include titanium (Ti), cobalt (Co), nickel (Ni), tungsten (W), another suitable material, or a combination thereof. In some embodiments, the conductive layer 108 is deposited using a CVD process, an ALD process, a physical vapor deposition (PVD) process, an electroplating process, an electroless plating process, another applicable process, or a combination thereof.

Figure 1C:
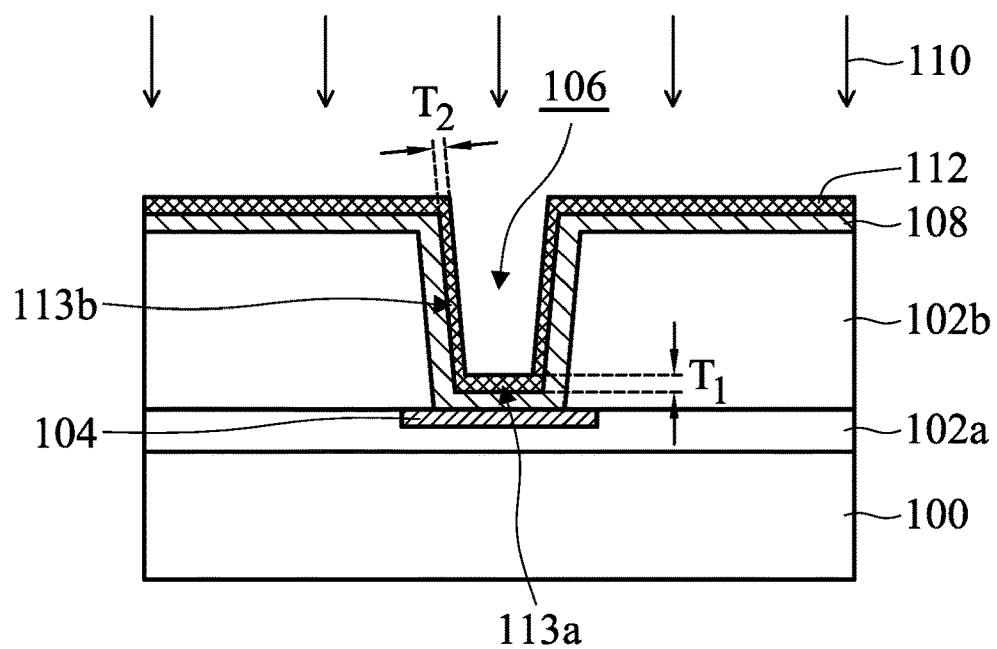

As shown in FIG. 1C, a plasma operation 110 is performed to modify an upper portion (or a surface portion) of the conductive layer 108 to form a modified region 112, in accordance with some embodiments. The modified region 112 contains one or more modifying elements to provide the modified region 112 with one or more functions. For example, the modified region 112 may function as an adhesion layer, a barrier layer, a seed layer, a passivation layer, a stop layer, or a combination thereof. In some embodiments, the modifying elements contain nitrogen, carbon, oxygen, another suitable element, or a combination thereof. In some embodiments, the conductive layer 108 is made of titanium. Due to the plasma operation 110, the upper portion of the conductive layer 108 is modified and transformed into the modified region 112. In these cases, the modified region 112 may include titanium nitride, titanium carbide, another suitable material, or a combination thereof.

In some embodiments, the modified region 112 is formed using an in-situ treatment. That is, the plasma operation 110 and the process for forming the conductive layer 108 are carried out in the same process chamber or in the same process system.

In some embodiments, the plasma operation 110 includes applying nitrogen-containing plasma on the conductive layer 108 so that the upper portion (or the surface portion) of the conductive layer 108 is modified to become the modified region 112. However, many variations and/or modifications can be made to embodiments of the disclosure. Other kinds of plasma may also be used. In some embodiments, plasma used in the plasma operation 110 includes carbon-containing plasma, oxygen-containing plasma, nitrogen-containing plasma, other suitable plasma, or a combination thereof.

In some embodiments, the reaction gas used in the plasma operation 110 includes $N_2$, $NH_3$, a combination of $N_2$ and $O_2$, CO, another suitable gas, or a combination thereof. In some embodiments, the power of the plasma generator used in the plasma operation 110 is in a range from about 70 W to about 500 W. In some embodiments, the flow rate of the reaction gas used in the plasma operation 110 is in a range from about 200 sccm to about 4000 sccm. In some embodiments, the process time of the plasma operation 110 is in a range from about 5 seconds to about 30 seconds.

In some embodiments, the modified region 112 has a uniform atomic concentration of the modifying element. However, embodiments of the disclosure are not limited thereto. In some other embodiments, the atomic concentration of the modifying element in the modified region 112 is not uniform. In some embodiments, since the outer portion of the conductive layer 108 has more chance to react with the plasma introduced during the plasma operation 110, the atomic concentration of the modifying element in the modified region 112 decreases along a direction from a surface of the modified region 112 towards the conductive element 104. In some other embodiments, the atomic concentration of the modifying element in the modified region 112 gradually decreases along a direction from a surface of the modified region 112 towards the conductive element 104.

In some embodiments, the modified region 112 has a first portion (or a bottom portion) 113*a* and a second portion (or a sidewall portion) 113*b*, as shown in FIG. 1C. The first portion 113*a* extends along the bottom of the opening 106, and the second portion 113*b* extends long the sidewall of the opening 106. The first portion 113*a* has a thickness $T_1$, and the second portion 113*b* has a thickness $T_2$. In some embodiments, the thicknesses $T_1$ and $T_2$ are substantially equal to each other. In some embodiments, the thickness $T_1$ or $T_2$ of the modified region 112 is in a range from about 10 Å to about 30 Å. However, embodiments of the disclosure are not limited thereto. In some other embodiments, the thicknesses $T_1$ and $T_2$ are different from each other. In some embodiments, the thickness $T_1$ is greater than the thickness $T_2$. In other words, the bottom portion (113*a*) of the modified region 112 is thicker than the sidewall portion (113*b*), in accordance with some embodiments. In some embodiments, a ratio of the thickness $T_1$ to the thickness $T_2$ ($T_1/T_2$) is in a range from about 1 to about 1.2. In some embodiments, the conductive layer 108, that is not modified to become the modified region 112, is thicker than the modified region 112.

Figure 1D:
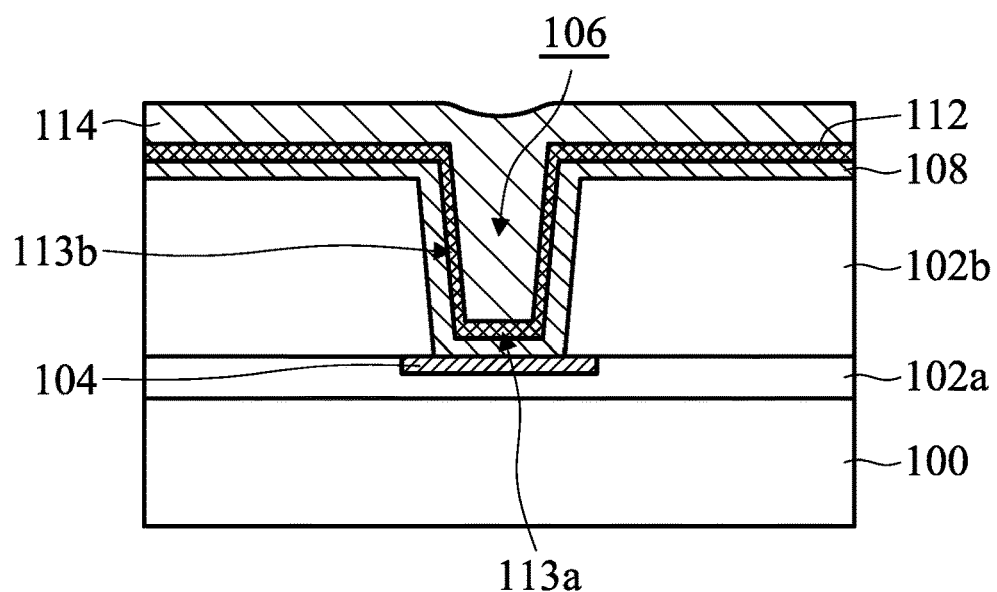

As shown in FIG. 1D, a conductive layer 114 is deposited over the modified region 112, in accordance with some embodiments. In some embodiments, the conductive layer 114 fills the opening 106. In some embodiments, the conductive layer 114 is made of a metal material. The metal material may include cobalt, tungsten, nickel, copper, aluminum, gold, titanium, another suitable material, or a combination thereof. In some embodiments, the conductive layer 114 is deposited using a CVD process, an electroplating process, an electroless plating process, an ALD process, a PVD process, another applicable process, or a combination thereof.

The modified region 112 may function as an adhesion layer. Therefore, adhesion between the conductive layer 114 and the conductive layer 108 are improved. The modified region 112 is formed through the plasma operation 110. No additional adhesion layer is formed on the conductive layer 108 to occupy the space in opening 106. The aspect ratio of the opening 106 is not further reduced, which facilitates the deposition of the conductive layer 114. In some embodiments, the conductive layer 114 fills the opening 106 without leaving any void. The quality and reliability of the semiconductor device structure are improved.

In some other cases, an additional adhesion layer is formed on the conductive layer 108. To ensure the additional adhesion layer is formed with continuity and conformity, the additional adhesion layer may need to have a sufficient thickness. As a result, too much space in the opening 106 is occupied by the additional adhesion layer, which negatively affects the subsequent filling of the conductive layer 114. There may be void formed in the conductive layer 114 especially for the opening 106 with small size. The quality and reliability of the semiconductor device structure may not be good enough.

Figure 1E:
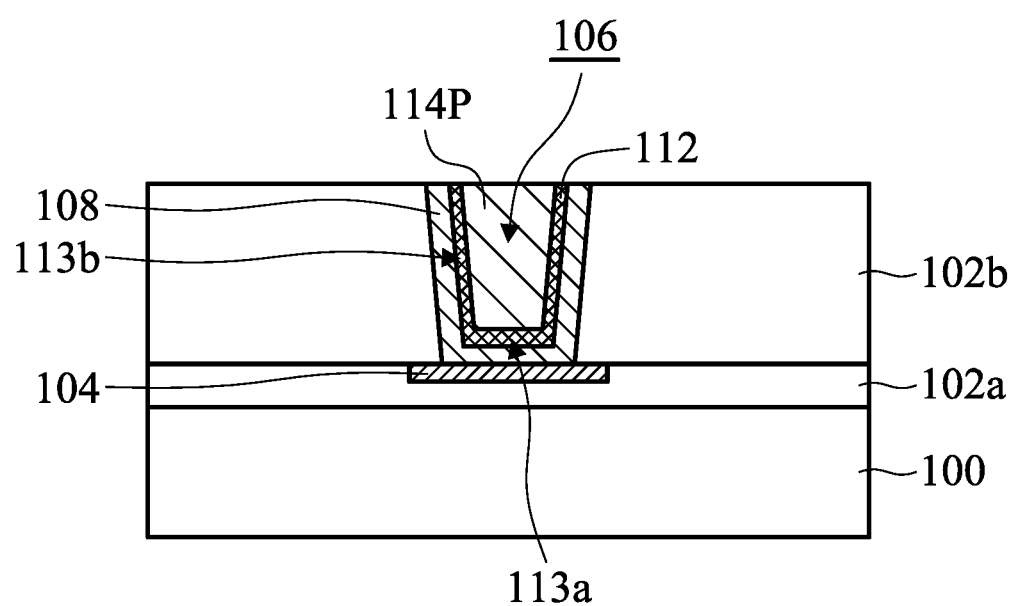

Afterwards, a planarization process is used to remove the portions of the conductive layer 108, the modified region 112, and the conductive layer 114 outside of the opening 106, as shown in FIG. 1E in accordance with some embodiments. As a result, the remaining portion of the conductive layer 114 forms a conductive plug 114P that fills the opening 106, as shown in FIG. 1E. The planarization process may include a chemical mechanical polishing (CMP) process, a grinding process, a dry polishing process, an etching process, another applicable process, or a combination thereof. The modified region 112 may function as an adhesion layer to connect the conductive plug 114P and the conductive layer 108. The modified region 112 may also function as a barrier layer to prevent the conductive layer 108 thereunder from being oxidized during the formation of the conductive plug 114P.

Figure 2A:
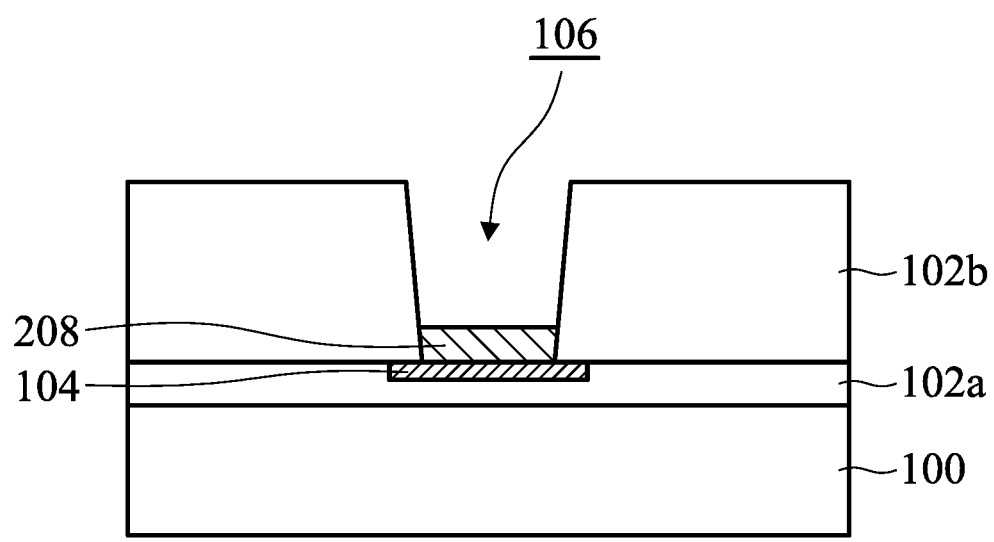
FIGS. 2A-2C are cross-sectional views of various stage of a process for forming a semiconductor device structure, in accordance with some embodiments.
Figure 2B:
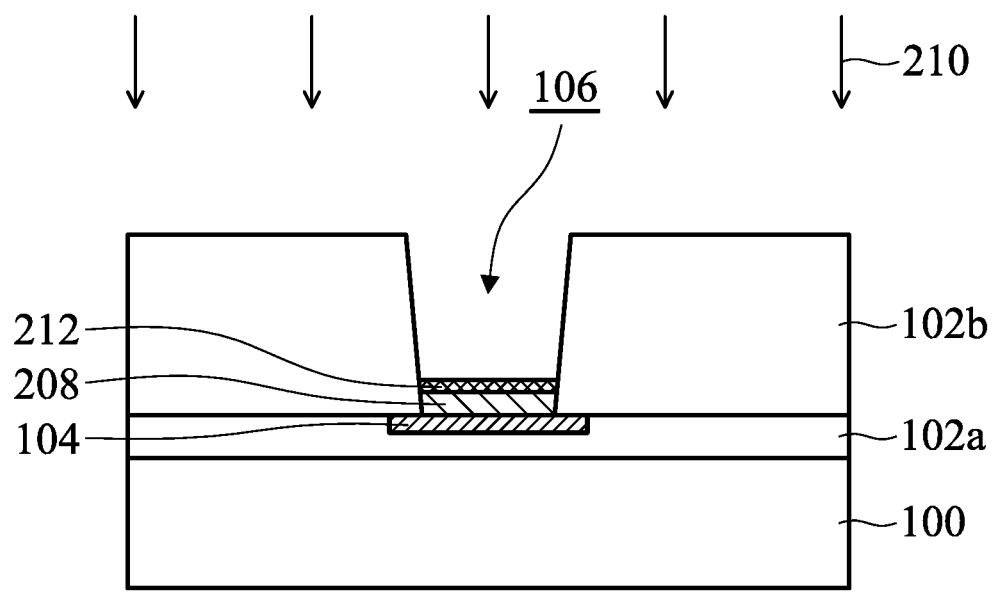
Figure 2C:
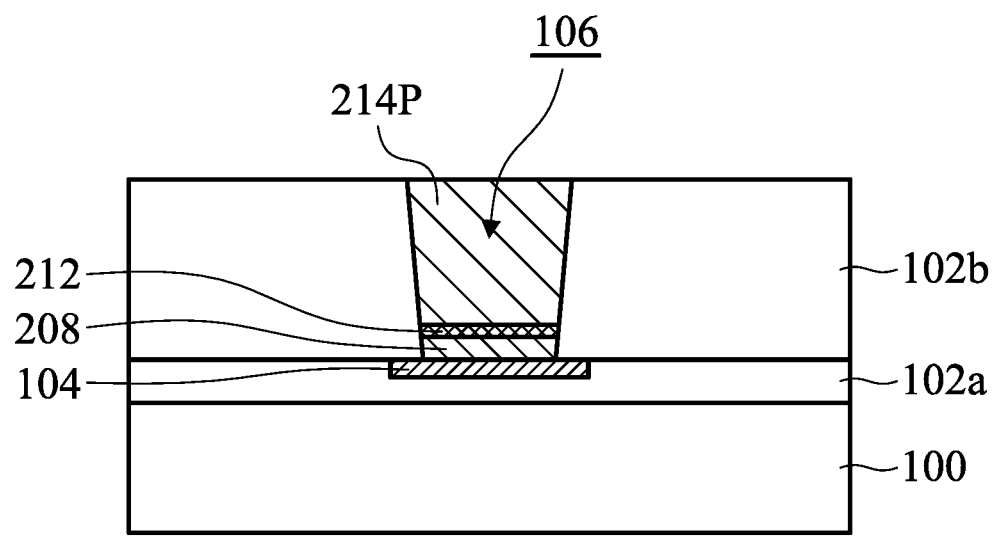

Many variations and/or modifications can be made to embodiments of the disclosure. FIGS. 2A-2C are cross-sectional views of various stages of a process for forming a semiconductor device structure, in accordance with some embodiments.

As shown in FIG. 2A, a structure similar to or the same as the structure shown in FIG. 1A is provided, in accordance with some embodiments. In some embodiments, a conductive layer 208 is formed on the conductive element 104. In some embodiments, the material of the conductive layer 208 is similar to or the same as that of the conductive layer 108 shown in FIG. 1B. In some embodiments, the conductive layer 208 is selectively deposited on the conductive element 104. For example, the conductive layer 208 is formed using an electroless plating process, an electroplating process, another applicable process, or a combination thereof. In some embodiments, a portion of the sidewall of the opening 106 is not covered by the conductive layer 208, as shown in FIG. 2A.

As shown in FIG. 2B, a modification operation 210 is performed to transform an upper portion of the conductive layer 208 into a modified region 212, in accordance with some embodiments. In some embodiments, the modification operation 210 is similar to or the same as the plasma operation 110 illustrated in FIG. 1C. The modified region 212 may also be similar to the modified region 110 shown in FIG. 1C and also contain the modifying element introduced by the modification operation 210. In some embodiments, the atomic concentration of the modifying element in the modified region 212 also gradually decreases along a direction from a surface of the modified region 212 towards the conductive element 104. In some embodiments, the modification operation 210 modifies the upper portion (or the surface portion) of the conductive layer 208 to form the modified region 212, and the dielectric layer 102b is substantially not modified. Therefore, the modified region is selectively formed on the conductive layer 208.

Afterwards, a conductive plug 214P is formed on the modified region 212 to fill the opening 106, as shown in FIG. 2C in accordance with some embodiments. In some embodiments, the material of the conductive plug 214P is similar to or the same as that of the conductive plug 114P shown in FIG. 1E. In some embodiments, the conductive plug 214P is formed using a bottom-up metal filling process. The bottom-up metal filling process may include an electroless plating process, an electroplating process, another applicable process, or a combination thereof.

The modified region 212 may function as an adhesion layer so that the adhesion between the conductive plug 214P and the conductive element 104 is improved. The modified region 212 may also function as a barrier layer or a passivation layer to prevent the conductive layer 208 thereunder from being oxidized during the subsequent formation of the conductive plug 214P. Since the conductive layer 208 and the modified region 212 are selectively formed on the bottom of the opening 106 without covering the sidewall of the opening 106, the aspect ratio of the opening 106 is not reduced. The formation of the conductive plug 214P may therefore be easier.

Many variations and/or modifications can be made to embodiments of the disclosure. FIGS. 3A-3E are cross-sectional views of various stages of a process for forming a semiconductor device structure, in accordance with some embodiments.

Figure 3A:
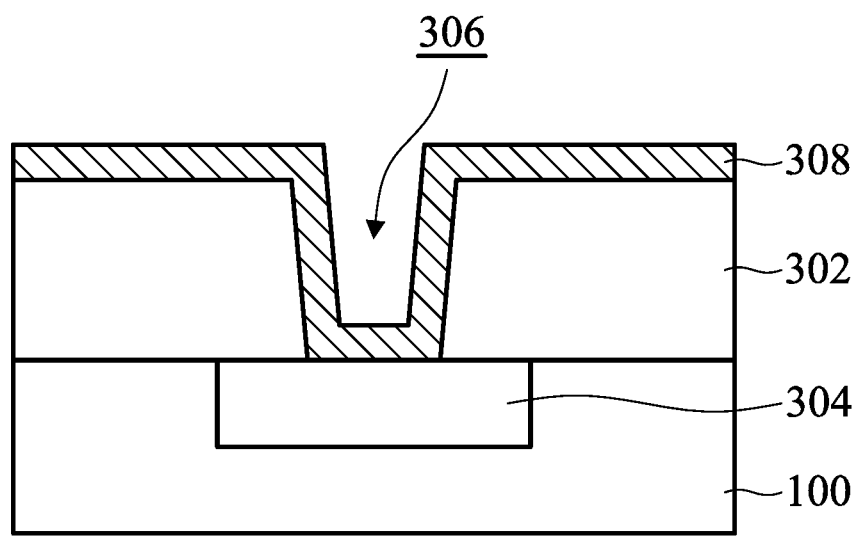
FIGS. 3A-3E are cross-sectional views of various stage of a process for forming a semiconductor device structure, in accordance with some embodiments.

As shown in FIG. 3A, a dielectric layer 302 is deposited over the semiconductor substrate 100, in accordance with some embodiments. In some embodiments, the material and formation method of the dielectric layer 302 are similar to or the same as those of the dielectric layer 102a or 102b.

Afterwards, an opening 306 is formed in the dielectric layer 302 to expose a conductive element 304 below the opening 306, as shown in FIG. 3A in accordance with some embodiments. The formation method of the opening 306 may similar to or the same as the opening 106 shown in FIG. 1A. In some embodiments, the opening 306 is used as a contact opening.

In some embodiments, the conductive element 304 contains a semiconductor material. In some embodiments, the conductive element 304 is a source or drain feature. The conductive element 304 may be a doped region formed in the semiconductor substrate 100. Alternatively, the conductive element 304 may be an epitaxially grown source/drain feature. In some embodiments, a portion of the conductive element 304 protrudes from a top surface of the semiconductor substrate. In some embodiments, the conductive element 304 is partially formed in a semiconductor fin structure on the semiconductor substrate 100. In some embodiments, the conductive element 304 includes silicon (Si), germanium (Ge), silicon germanium (SiGe), another suitable semiconductor material, or a combination thereof.

Afterwards, a conductive layer 308 is deposited over the dielectric layer 302 and the conductive element 304, as shown in FIG. 3A in accordance with some embodiments. In some embodiments, the material and formation method of the conductive layer 308 are similar to or the same as those of the conductive layer 108 shown in FIG. 1B.

Figure 3B:
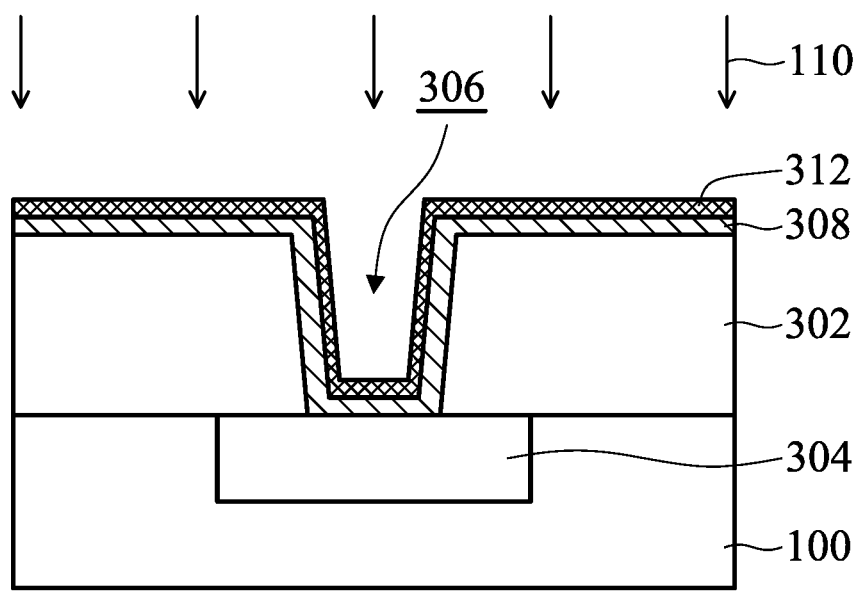

As shown in FIG. 3B, a modification operation such as the plasma operation 110 is performed to modify an upper portion (or a surface portion) of the conductive layer 308, in accordance with some embodiments. As a result, a modified region 312 is formed. The modified region 312 may be similar to the modified region 112 shown in FIG. 1C. In some embodiments, the atomic concentration of the modifying element in the modified region 312 also gradually decreases along a direction from a surface of the modified region 312 towards the conductive element 304. In some embodiments, the portion of the modified region 312 directly on the bottom of the opening 306 is thicker than the portion of the modified region 312 extending on the sidewall of the opening 306.

Figure 3C:
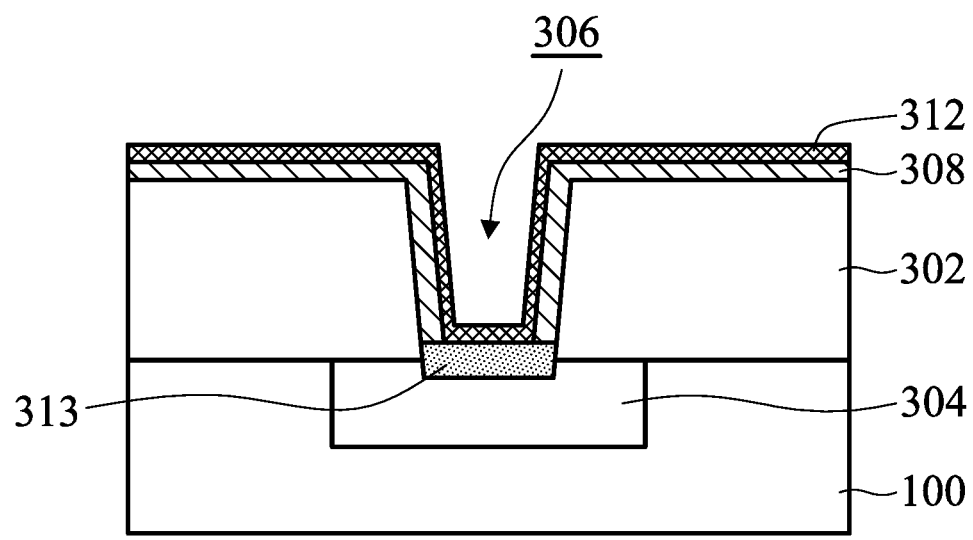

As shown in FIG. 3C, a metal-semiconductor compound region 313 is formed between the conductive layer 308 and the conductive element 304, in accordance with some embodiments. In some embodiments, a salicidation (self-aligned silicidation) process is used to form the metal-semiconductor compound region 313. In some embodiments, a thermal operation is carried out to cause a reaction between the conductive layer 308 and the conductive element 304 that contains a semiconductor material, such as silicon. As a result, a portion of the conductive layer 308 and a portion of the conductive element 304 are reacted with each other to form the metal-semiconductor compound region 313.

The metal-semiconductor compound region 313 may include a metal silicide region, a metal-germanium compound region, a metal germanosilicide region, or the like. In some embodiments, the metal-semiconductor compound region 313 contains one or more semiconductor materials. The semiconductor materials may include silicon, germanium, compound semiconductor material (such as gallium arsenide, silicon carbide, indium arsenide, indium phosphide), another suitable semiconductor material, or a combination thereof. The metal-semiconductor compound region 313 may have a lower resistance, which allows a better electrical connection to the conductive element 304.

In some embodiments, the metal-semiconductor compound region 313 is made of titanium silicide, nickel silicide, cobalt silicide, titanium silicon germanium, another suitable material, or a combination thereof. In some embodiments, the metal-semiconductor compound region 313 is in direct contact with the un-reacted portions of the conductive layer 308, such as the portions of the conductive layer 308 extending on the sidewall of the opening 306. In some embodiments, the metal-semiconductor compound region 313 is also in direct contact with the modified region 312.

In some embodiments, the modified region 312 functions as a barrier layer that prevents oxygen from reaching the interface between the conductive element 304 and the conductive layer 308 during the salicidation process. Therefore, there is no oxygen negatively affecting the formation of the metal-semiconductor compound region 313. The conductive layer 308, the metal-semiconductor compound region 313, and the conductive element 304 may also prevented from being oxidized during the thermal operation for forming the metal-semiconductor compound region 313.

Figure 3D:
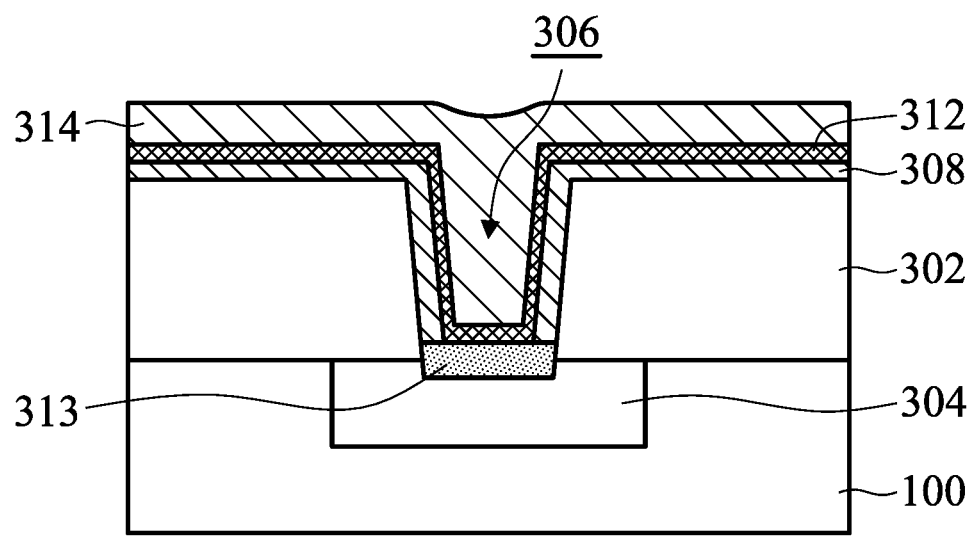

As shown in FIG. 3D, a conductive layer 314 is deposited over the modified region 312 to fill the opening 306, in accordance with some embodiments. The material and formation method of the conductive layer 314 may be similar to or the same as those of the conductive layer 114 shown in FIG. 1D. The modified region 312 may also function as an adhesion layer to improve the adhesion between the conductive layer 308 and the conductive layer 314. The adhesion between the conductive layer 314 and the metal-semiconductor compound region 313 may also be improved.

As mentioned above, the modified region 312 may function as a barrier layer and an adhesion layer. No additional layer is formed on the conductive layer 308 to occupy the space in the opening 306. The aspect ratio of the opening 306 is not further reduced, which facilitates the deposition of the conductive layer 314. In some embodiments, the conductive layer 314 fills the opening 106 without leaving any void. The quality and reliability of the semiconductor device structure are improved.

Figure 3E:
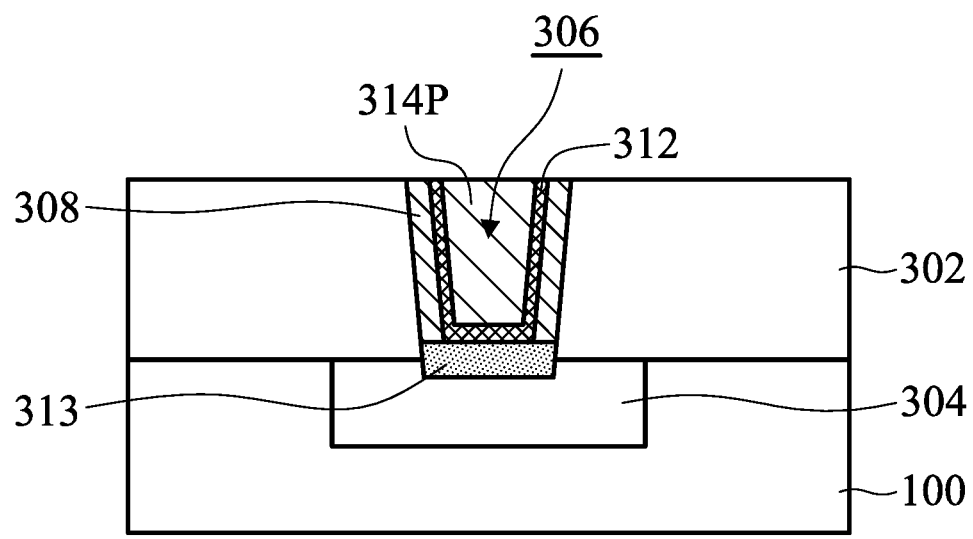

Afterwards, a planarization process is carried out to remove the portions of the conductive layer 308, the modified region 312, and the conductive layer 314 outside of the opening 306, as shown in FIG. 3E in accordance with some embodiments. As a result, the remaining portion of the conductive layer 314 forms a conductive plug 314P. The planarization process may include a CMP process, a grinding process, a dry polishing process, an etching process, another applicable process, or a combination thereof.

Many variations and/or modifications can be made to embodiments of the disclosure. FIGS. 4A-4D are cross-sectional views of various stages of a process for forming a semiconductor device structure, in accordance with some embodiments.

Figure 4A:
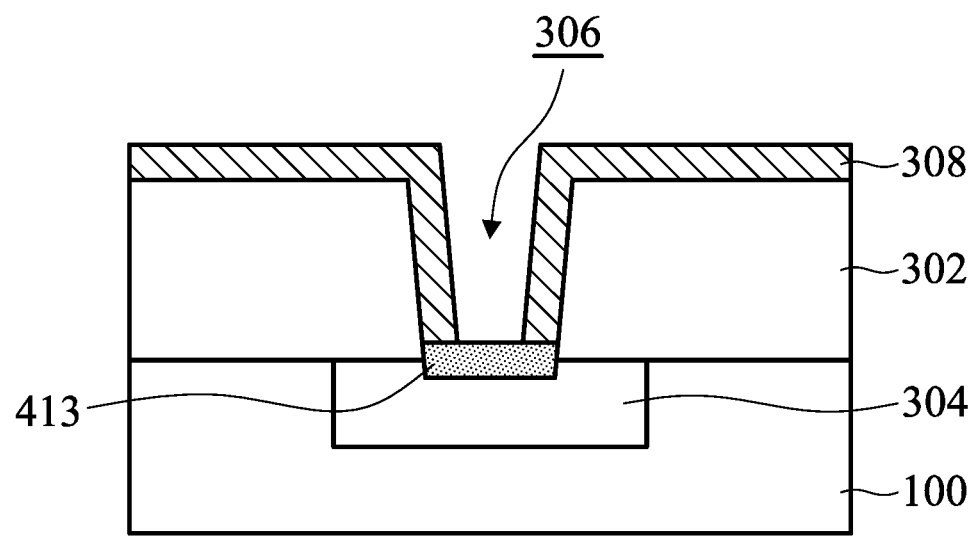
FIGS. 4A-4D are cross-sectional views of various stage of a process for forming a semiconductor device structure, in accordance with some embodiments.

As shown in FIG. 4A, a structure similar to the structure shown in FIG. 3A is provided, in accordance with some embodiments. The main difference therebetween is that the conductive layer 308 shown in FIG. 4A is deposited at a high temperature. In some embodiments, a deposition process, such as a CVD process or an ALD process, is carried out at a high temperature. Therefore, during the formation of the conductive layer 308, the reaction between the conductive element 304 and the deposited conductive layer 308 is also initialized.

Once the heated conductive material for forming the conductive layer 308 is in contact with the surface of the conductive element 304, a reaction between the semiconductor material of the conductive element 304 and the heated conductive material may occur. As a result, a metal-semiconductor compound region 413 is formed between the conductive element 304 and the conductive layer 308, as shown in FIG. 4A. In some embodiments, the metal-semiconductor compound region 413 and the conductive layer 308 are formed simultaneously.

In some embodiments, the metal-semiconductor compound region 413 contains one or more semiconductor materials. The semiconductor materials may include silicon, germanium, compound semiconductor material (such as gallium arsenide, silicon carbide, indium arsenide, indium phosphide), another suitable semiconductor material, or a combination thereof. For example, the metal-semiconductor compound region 413 includes metal silicide, metal germanosilicide, or metal-germanium compound, such as titanium silicide, nickel silicide, cobalt silicide, titanium silicon germanium, another suitable material, or a combination thereof.

Figure 4B:
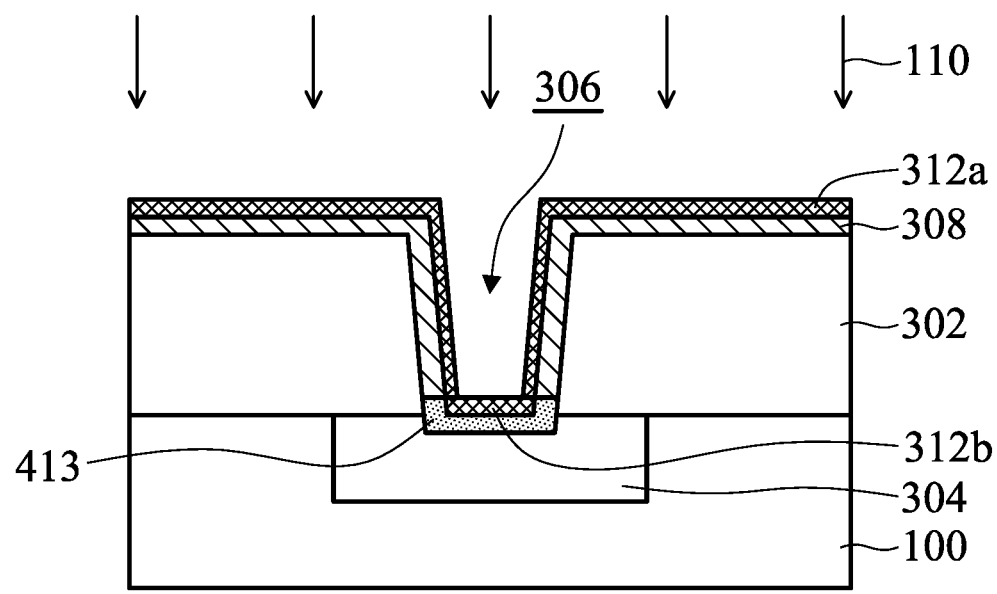

As shown in FIG. 4B, a modification operation such as the plasma operation 110 is performed to modify an upper portion (or a surface portion) of the conductive layer 308 to form a first modified region 312a, in accordance with some embodiments. In some embodiments, the plasma operation 110 also modifies an upper portion (or a surface portion) of the metal-semiconductor compound region 413 to form a second modified region 312b. In some embodiments, the second modified region 312b connects to the first modified region 312a. In some embodiments, the second modified region 312b is thicker than the first modified region 312a.

The first modified region 312a may be similar to the modified region 112 shown in FIG. 1C and contain the modifying element. In some embodiments, the atomic concentration of the modifying element in the first modified region 312a also gradually decreases along a direction from a surface of the first modified region 312a towards the conductive element 304.

In some embodiments, the second modified region 312b also contains the same modifying element in the first modified region 312a since the first modified region 312a and the second modified region 312b are formed using the same plasma operation 110. In some embodiments, the atomic concentration of the modifying element in the second modified region 312b also gradually decreases along a direction from a surface of the second modified region 312b towards the conductive element 304. In some embodiments, the second modified region also contains a semiconductor material that is originally in the metal-semiconductor compound region 413. In some embodiments, the second modified region 312b has an atomic concentration of the semiconductor material greater than that of the first modified region 312a. In some embodiments, the atomic concentration of the modifying element in the second modified region 312b is smaller than that in the first modified region 312a.

In some embodiments, the first modified region 312a and the second modified region 312b function as barrier layers that prevent oxygen from reaching the conductive layer 308 and the metal-semiconductor compound region 413. Therefore, the conductive layer and the metal-semiconductor compound region 413 are prevented from being oxidized. The first modified region 312a and the second modified region 312b may also function as adhesion layers to ensure the adhesion to a subsequently formed conductive layer.

Figure 4C:
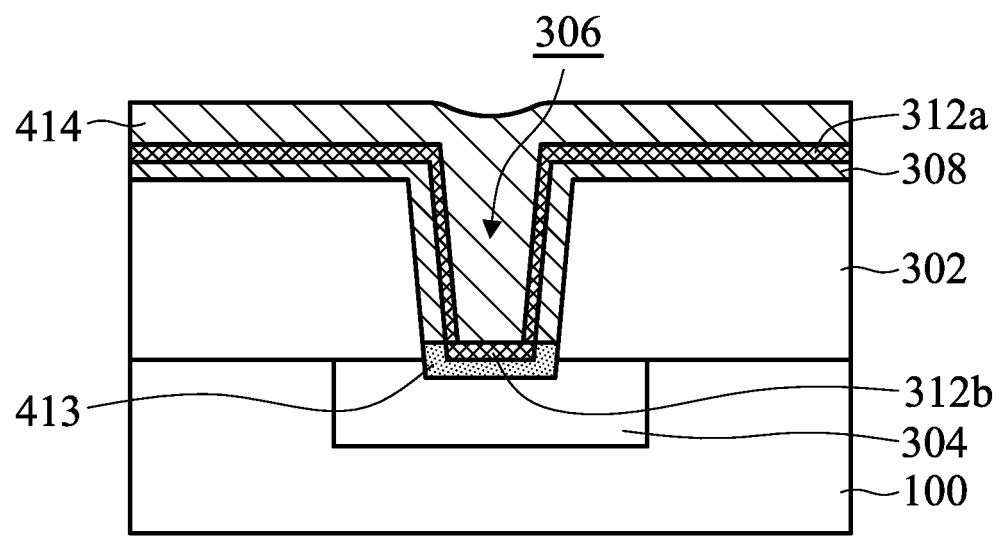

As shown in FIG. 4C, a conductive layer 414 is deposited over the first modified region 312a and the second modified region 312b to fill the opening 306, in accordance with some embodiments. The material and formation method of the conductive layer 414 may be similar to or the same as those of the conductive layer 114 shown in FIG. 1D.

As mentioned above, the first modified region 312a and the second modified region 312b may function as barrier layers and adhesion layers. No additional layer is formed on the conductive layer 308 to occupy the space in the opening 306. The aspect ratio of the opening 306 is not further reduced, which facilitates the deposition of the conductive layer 414. In some embodiments, the conductive layer 414 fills the opening 106 without leaving any void. The quality and reliability of the semiconductor device structure are improved.

Figure 4D:
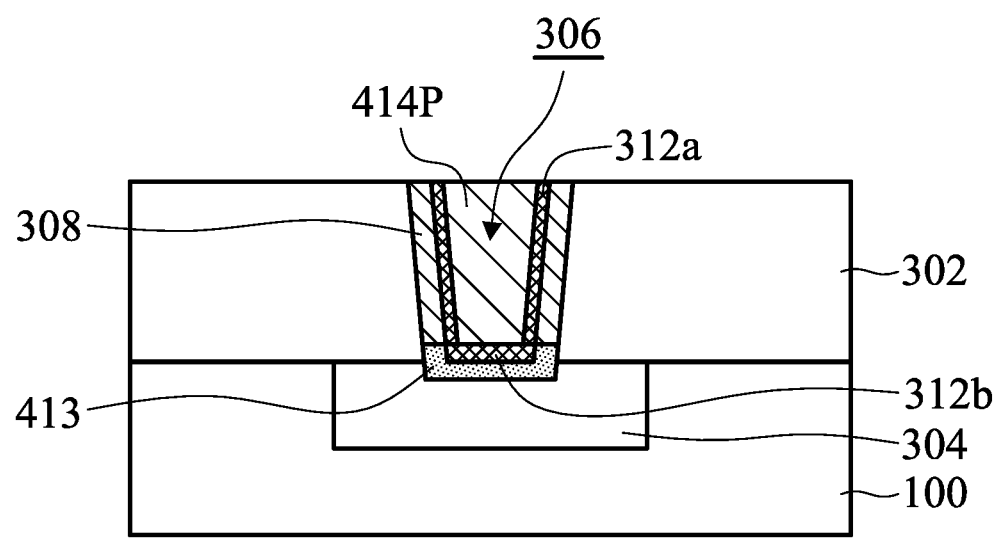

Afterwards, a planarization process is carried out to remove the portions of the conductive layer 308, the modified region 312, and the conductive layer 414 outside of the opening 306, as shown in FIG. 4D in accordance with some embodiments. As a result, the remaining portion of the conductive layer 414 forms a conductive plug 414P. The planarization process may include a CMP process, a grinding process, a dry polishing process, an etching process, another applicable process, or a combination thereof.

Embodiments of the disclosure use a plasma operation to modify an upper portion (or a surface portion) of a conductive layer in an opening to form a modified region. The modified region may have multiple functions such as adhesion, barrier, or the like. No additional adhesion or barrier layer is formed on the conductive layer to occupy the space in the opening. The aspect ratio of the opening is not further reduced, which facilitates the filling of the conductive layer in the opening. The quality and reliability of the semiconductor device structure are significantly improved.

In accordance with some embodiments, a method for forming a semiconductor device structure is provided. The method includes forming a dielectric layer over a semiconductor substrate and forming an opening in the dielectric layer to expose a conductive element. The method also includes forming a conductive layer over the conductive element and modifying an upper portion of the conductive layer using a plasma operation to form a modified region. The method further includes forming a conductive plug over the modified region.

In accordance with some embodiments, a method for forming a semiconductor device structure is provided. The method includes forming a dielectric layer over a semiconductor substrate and forming an opening in the dielectric layer to expose a conductive element. The method also includes forming a conductive layer over the conductive element and transforming an upper portion of the conductive layer into a modified region. The modified region is conductive. The method further includes forming a conductive plug on the modified region to fill the opening.

In accordance with some embodiments, a semiconductor device structure is provided. The semiconductor device structure includes a dielectric layer over a semiconductor substrate and an opening in the dielectric layer. The semiconductor device structure also includes a conductive element below the opening and a conductive layer partially or completely in the opening. The conductive layer is electrically connected to the conductive element, and an upper portion of the conductive layer is a modified region containing a modifying element. An atomic concentration of the modifying element decreases along a direction from a surface of the modified region towards the conductive element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a dielectric layer over a semiconductor substrate;
    forming an opening in the dielectric layer to expose a conductive element;
    forming a conductive layer over the conductive element;

modifying an upper portion of the conductive layer using a plasma operation to form a modified region, wherein plasma used in the plasma operation comprises carbon-containing plasma; and forming a conductive plug over the modified region to fill the opening, wherein the conductive plug is substantially made of a single-element metal, the conductive plug is in direct contact with the modified region, and there is no additional layer formed on the conductive layer to occupy space in the opening before the conductive plug is formed.

2. The method for forming a semiconductor device structure as claimed in claim 1, wherein the plasma operation further comprises applying nitrogen-containing plasma on the conductive layer so that the upper portion of the conductive layer is modified to become the modified region.

3. The method for forming a semiconductor device structure as claimed in claim 1, wherein plasma used in the plasma operation further comprises nitrogen-containing plasma, oxygen-containing plasma, or a combination thereof.

4. The method for forming a semiconductor device structure as claimed in claim 1, wherein the conductive layer is selectively deposited on the conductive element.

5. The method for forming a semiconductor device structure as claimed in claim 1, wherein the conductive layer is formed on a sidewall and a bottom of the opening.

6. The method for forming a semiconductor device structure as claimed in claim 1, wherein the conductive plug is selectively deposited on the modified region.

7. The method for forming a semiconductor device structure as claimed in claim 1, further comprising forming a metal-semiconductor compound region between the conductive layer and the conductive element, wherein the conductive element contains a semiconductor material.

8. The method for forming a semiconductor device structure as claimed in claim 7, wherein the conductive element and the conductive layer is heated to form the metal-semiconductor compound region after the formation of the modified region.

9. The method for forming a semiconductor device structure as claimed in claim 7, wherein a lower portion of the conductive layer that overlaps with the conductive element is converted to be the metal-semiconductor compound region, and the metal-semiconductor compound region and the conductive layer are formed simultaneously.

10. The method for forming a semiconductor device structure as claimed in claim 9, wherein an upper portion of the metal-semiconductor compound region is modified by the plasma operation and transformed to be a second modified region.

11. The method for forming a semiconductor device structure as claimed in claim 1, further comprising removing a portion of the modified region outside of the opening.

12. A method for forming a semiconductor device structure, comprising:
forming a dielectric layer over a semiconductor substrate;
forming an opening in the dielectric layer to expose a conductive element;
forming a conductive layer over the conductive element;
transforming an upper portion of the conductive layer into a modified region using a plasma operation, wherein the modified region is conductive, and plasma used in the plasma operation comprises carbon-containing plasma; and
forming a conductive plug on the modified region to fill the opening, wherein the conductive plug is a single layer, the conductive plug is in direct contact with the modified region, and there is no additional layer formed on the conductive layer to occupy space in the opening before the conductive plug is formed.

13. The method for forming a semiconductor device structure as claimed in claim 12, wherein the upper portion of the conductive layer is transformed into the modified region using the plasma operation.

14. The method for forming a semiconductor device structure as claimed in claim 12, further comprising heating the conductive layer and the conductive element after the modified region is formed, such that a portion of the conductive layer and a portion of the conductive element are reacted to form a metal-semiconductor compound region.

15. The method for forming a semiconductor device structure as claimed in claim 12, wherein the conductive layer is selectively deposited on the conductive element such that a portion of a sidewall of the opening is not covered by the conductive layer.

16. A method for forming a semiconductor device structure, comprising:
forming a dielectric layer over a semiconductor substrate;
forming an opening in the dielectric layer to expose a conductive element;
forming a conductive layer over the conductive element such that a lower portion of the conductive layer and a portion of the conductive element overlapping the lower portion of the conductive layer are reacted to be converted to be a metal-semiconductor compound region;
modifying an upper portion of the conductive layer to form a first modified region;
modifying an upper portion of the metal-semiconductor compound region using a plasma operation to form a second modified region, wherein plasma used in the plasma operation comprises carbon-containing plasma; and
forming a conductive plug over the second modified region to fill the opening, wherein the conductive plug is substantially made of a single-element metal, the conductive plug is in direct contact with the first modified region, and there is no additional layer formed on the conductive layer to occupy space in the opening before the conductive plug is formed.

17. The method for forming a semiconductor device structure as claimed in claim 16, wherein the first modified region and the second modified region are formed by introducing a modifying element into the upper portions of the conductive layer and the metal-semiconductor compound region.

18. The method for forming a semiconductor device structure as claimed in claim 17, wherein the second modified region is thicker than the first modified region, and the first modified region extends along a sidewall of the opening.

19. The method for forming a semiconductor device structure as claimed in claim 17, wherein the modifying element is introduced into the upper portions of the conductive layer and the metal-semiconductor compound region using a same plasma operation.

20. The method for forming a semiconductor device structure as claimed in claim 19, wherein an atomic concentration of the modifying element decreases along a direction from a surface of the second modified region towards the conductive element.

* * * * *